United States Patent
Koerner

(10) Patent No.: US 7,911,280 B2
(45) Date of Patent: Mar. 22, 2011

(54) AMPLIFIER STAGE

(75) Inventor: Hans Peter Koerner, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 12/501,526

(22) Filed: Jul. 13, 2009

(65) Prior Publication Data

US 2011/0006845 A1    Jan. 13, 2011

(51) Int. Cl.
*H03F 3/04* (2006.01)

(52) U.S. Cl. .......................... 330/311; 330/300

(58) Field of Classification Search ................. 330/311, 330/150, 310, 300, 98
See application file for complete search history.

(56) References Cited

U.S. PATENT DOCUMENTS

| | | | |
|---|---|---|---|
| 4,460,876 A * | 7/1984 | Najman | 330/296 |
| 4,496,909 A | 1/1985 | Knapp | |
| 4,885,548 A | 12/1989 | Wakimoto et al. | |
| 4,940,949 A * | 7/1990 | Landi | 330/262 |
| 5,867,061 A | 2/1999 | Rabjohn et al. | |
| 6,858,895 B2 | 2/2005 | Feldtkeller et al. | |
| 7,242,253 B2 * | 7/2007 | Motta et al. | 330/311 |
| 7,489,202 B1 | 2/2009 | Griffiths et al. | |
| 7,598,814 B1 * | 10/2009 | Jin et al. | 330/311 |

FOREIGN PATENT DOCUMENTS

FR    2 536 224 A1    5/1984

OTHER PUBLICATIONS

L. Wu et al., "The Integrated 2W High Voltage/High Power 0.12-mm RF CMOS Power Amplifier", 34th European Microwave Conference—Amsterdam 2004, pp. 53-56.

* cited by examiner

*Primary Examiner* — Henry K Choe
(74) *Attorney, Agent, or Firm* — Peter F. Corless; Christine C. O'Day; Edwards Angell Palmer & Dodge LLP

(57) ABSTRACT

An amplifier stage for generating an amplified output signal from an input signal, a mobile device comprising an audio amplifier, and an amplification method for generating an amplified output signal from an input signal using an amplifier stage are described.

11 Claims, 4 Drawing Sheets

AMPLIFIER STAGE

BACKGROUND OF THE INVENTION

The present invention relates to an amplifier stage, a mobile device utilizing the amplifier stage as an audio amplifier, and an amplification method using an amplifier stage.

BRIEF SUMMARY OF THE INVENTION

According to an embodiment of the present invention, an amplifier stage for generating an amplified output signal at an output terminal of the amplifier stage from an input signal at an input terminal of the amplifier stage is provided. The amplifier stage comprises a first active device, a second active device and a control circuit. The first active device comprises a first terminal, a second terminal, and a control input controlling a current between the first terminal and the second terminal of the first active device. The control input of the first active device is coupled to the input terminal of the amplifier stage. The second active device comprises a first terminal, a second terminal, and a control input controlling a current between the first terminal and the second terminal of the second active device. The first terminal of the second active device is coupled to the second terminal of the first active device, and the second terminal of the second active device is coupled to the output terminal of the amplifier stage. The control circuit is coupled between the control input of the second active device and the input terminal of the amplifier stage. The control circuit is configured to force the voltage at the second terminal of the first active device to follow the input voltage at the control input of the first active device.

Amplifier stages are widely used especially for example as audio amplifiers in consumer electronics, for example in mobile devices, like mobile phones. Such amplifier stages commonly comprise active devices, like transistors, to amplify an input signal, for example from a microphone, to an amplified output signal. However, active devices, especially field effect transistors, are affected by the so-called Miller effect, an unwanted non-linear type of feedback. The Miller effect impairs performance at high frequencies and even impacts audio quality at much lower frequency. Typically, the Miller effect occurs as the voltage varies between for example a gate and a drain of a junction field effect transistor (JFET), as the non-linear inherent capacitance is modulated by the signal voltage. Higher voltage gains will increase the problem.

The amplifier stage according to an embodiment of the present invention as defined above eliminates the Miller effect by forcing the voltage of the second terminal of the first active device to follow the input voltage at the control input of the first active device. Consequently, no voltage swing will occur across the non-linear capacitance between the second terminal of the first active device and the control input of the first active device, thus eliminating the Miller effect.

According to an embodiment of the present invention, the control circuit is further adapted to prevent any coupling from the output signal to the input signal of the amplifier stage. This avoids getting the Miller effect at the second active device, thus completely eliminating the Miller effect from the amplifier stage.

The amplifier stage may further comprise a resistor coupled between the output terminal of the amplifier stage and a supply voltage. Furthermore, the amplifier stage may comprise a first capacitor and a second capacitor. The first capacitor may couple the input terminal of the amplifier stage to the control input of the first active device, and the second capacitor may couple the input terminal of the amplifier stage to the control input of the second active device. Furthermore, the amplifier stage may comprise a bias resistor coupled between the control input of the first active device and a bias voltage. The above-described configuration of the amplifier stage is adapted to amplify an alternating current (AC) signal, for example an audio signal, for example from a microphone.

The first active device may comprise a transistor, a bipolar transistor, a field effect transistor (FET) or a junction field effect transistor (JFET). Preferably, the first active device comprises a junction field effect transistor.

The second active device may also comprise a transistor, a bipolar transistor, a field effect transistor or a junction field effect transistor. Preferably, the second active device comprises a bipolar transistor.

According to another embodiment of the amplifier stage, the control circuit comprises a complementary JFET source follower circuit composed of a p-channel junction field effect transistor and an n-channel junction field effect transistor.

Each junction field effect transistor comprises a source terminal, a gate terminal, and a drain terminal. The source terminal of the p-channel transistor is coupled to the control input of the second active device and the source terminal of the n-channnel transistor is also coupled to the control input of the second active device. The gate terminal of the p-channel transistor is coupled to the input terminal of the amplifier stage, and also the gate terminal of the n-channel transistor is coupled to the input terminal of the amplifier stage. Furthermore, the amplifier stage may comprise a first diode and a second diode. The first diode may be coupled between the source terminal of the n-channel transistor and the control input of the second active device. The second diode may be coupled between the source terminal of the p-channel transistor and the control input of the second active device.

The above described control circuit provides good backwards isolation properties, preventing any high frequency voltage coupled onto its output through the non-linear capacitance of the second active device from reaching its input. Any voltage applied to the control circuit output is not allowed to propagate to its input regardless of frequency. The complementary JFET source follower will do this and provides a well extended bandwidth.

The control circuit may comprise furthermore a bias resistor coupling the gate terminal of the n-channel transistor and the gate terminal of the p-channel transistor to a bias voltage.

According to another embodiment, the control circuit may comprise a non-complementary buffer, especially if only a limited bandwidth or small signal amplitudes are required.

According to another embodiment of the present invention, an amplifier stage for generating an amplified output signal is provided. The amplifier stage provides the amplified output signal at an output terminal of the amplifier stage based on an input signal at an input terminal of the amplifier stage. The amplifier stage comprises a first transistor, a second transistor, a third transistor and a fourth transistor. The first transistor is a field effect transistor (FET) comprising a source terminal, a drain terminal, and a gate terminal. The gate terminal of the first transistor is coupled to the input terminal of the amplifier stage via a first capacitor of the amplifier stage. The gate terminal of the first transistor is furthermore coupled to a first bias voltage via a first bias resistor of the amplifier stage. The second transistor is a bipolar transistor comprising an emitter terminal, a collector terminal, and a base terminal. The emitter terminal of the second transistor is coupled to the drain terminal of the first transistor, and the collector terminal of the second transistor is coupled to the output terminal of the amplifier stage. The third transistor is a p-channel field effect transistor comprising a source terminal, a drain terminal and a gate terminal. The source terminal of the third transistor is coupled to the base terminal of the second transistor via a first diode of the amplifier stage. The drain terminal of the third transistor is coupled to a first supply voltage.

The gate terminal of the third transistor is coupled to the input terminal of the amplifier stage via a second capacitor of the amplifier stage and coupled to a second bias voltage via a second bias resistor of the amplifier stage. The fourth transistor is an n-channel field effect transistor comprising a source terminal, a drain terminal and a gate terminal. The source terminal of the fourth transistor is coupled to the base terminal of the second transistor via second diode of the amplifier stage. The drain terminal of the fourth transistor is coupled to a second supply voltage. The gate terminal of the fourth transistor is coupled to the input terminal of the amplifier stage via the second capacitor of the amplifier stage and is coupled to the second bias voltage via the second bias resistor.

In this amplifier stage with the second (bipolar) transistor being coupled to the drain terminal of the first (FET) transistor, the voltage of the drain terminal of the first transistor follows the input voltage at the gate terminal of the first transistor. Consequently, no voltage swing will occur across the non-linear gate-drain capacitance thus eliminating the Miller effect. The low Ohmic emitter of the bipolar transistor (second transistor) will easily control the high Ohmic drain of the field effect transistor (first transistor), if the input signal is also fed to the base of the bipolar transistor (second transistor). To avoid getting the Miller effect at the bipolar transistor, its base is connected to the input of the amplifier stage via an isolating and fast buffer comprised of the third and the fourth transistors and the first and the second diodes. This buffer provides a good backwards isolation property, preventing any high frequency voltage coupled onto its output (through the non-linear collector-base capacitance of the bipolar transistor) from reaching its input.

According to another embodiment of the present invention, a mobile device is provided. The mobile device comprises a microphone and an audio amplifier coupled to the microphone. The audio amplifier comprises an amplifier stage for generating an amplified output signal at an output terminal of the amplifier stage from an input signal from the microphone at an input terminal at the amplifier stage. The amplifier stage comprises a first active device, a second active device, and a control circuit. The first active device comprises a control input controlling a current between a first terminal of the first active device and a second terminal of the first active device. The control input of the first active device is coupled to the input terminal of the amplifier stage. The second active device comprises a control input controlling a current between a first terminal of the second active device and a second terminal of the second active device. The first terminal of the second active device is coupled to the second terminal of the first active device, and the second terminal of the second active device is coupled to the output terminal of the amplifier stage. The control circuit is coupled between the control input of the second active device and the input terminal of the amplifier stage. The control circuit is configured to force a voltage at the second terminal of the first active device to follow the input voltage at the control input of the first active device. The mobile device may comprise a mobile phone, a personal digital assistant, a mobile navigation system or a mobile computer.

According to another embodiment of the present invention, an amplification method for generating an amplified output signal from an input signal using an amplifier stage is provided. The amplifier stage comprises an active device comprising an output terminal and a control input controlling a current at the output terminal of the active device. According to the method a voltage at the output terminal of the active device is forced to follow an input voltage at the control input of the active device. Furthermore, according to the method, any coupling from the output signal of the amplifier stage to the input voltage of the amplifier stage is prevented.

Although specific features described in the above summary and in the following detailed description are described in connection with specific embodiments, it is to be understood that the features of the embodiments described can be combined with each other unless it is noted otherwise.

BRIEF DESCRIPTION OF THE DRAWINGS

Hereinafter, exemplary embodiments of the invention will be described with reference to the drawings.

DETAILED DESCRIPTION OF THE INVENTION

Figure 1:
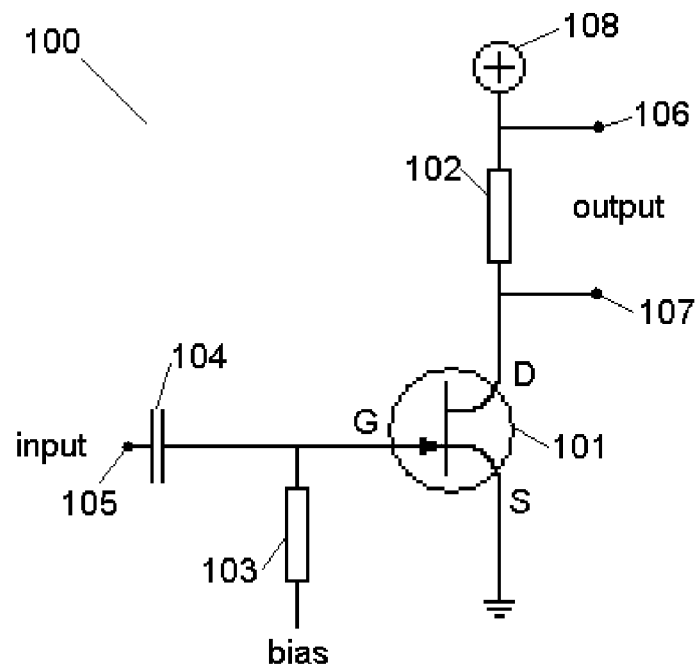
FIG. 1 shows a circuit diagram of an inverting voltage amplifier stage.

In the following, exemplary embodiments of the present invention will be described in detail. It is to be understood that the following description is given only for the purpose of illustrating the principles of the invention and it is not to be taken in limiting sense. Rather, the scope of the invention is defined only by the appended claims and is not intended to be limited by the exemplary embodiments hereinafter.

It is to be understood that in the following detailed description of the embodiment, any direct connection or coupling between functional blocks, devices, components or other physical or functional units shown in the drawings or description herein could also be implemented by an indirect connection or coupling. Same reference signs in the various instances of the drawings refer to similar or identical components.

It is further to be understood that the features of the various exemplary embodiments described herein may be combined with each other unless specifically noted otherwise.

FIG. 1 shows a common source JFET amplifier stage comprising a junction field effect transistor (JFET) 101, an output resistor 102, a bias resistor 103, and a capacitor 104. A gate terminal G of the JFET 101 is connected via the bias resistor 103 to a bias voltage and is furthermore connected via the capacitor 104 to an input 105 of the amplifier stage 100. The source terminal S of the JFET 101 is connected to ground. The drain terminal D of the JFET 101 is connected via the output resistor 102 to a supply voltage. An input signal, for example an alternating current signal, to be amplified is applied to the gate terminal of the JFET 101 via the input terminal 105 and the capacitor 104. Depending on the input signal an output signal is generated as an output voltage across the output resistor 102 at output terminals 106, 107 of the amplifier stage 100.

The amplifier stage 100 of FIG. 1 may be used for example in a mobile device for amplifying an audio signal received from a microphone. However, the amplifier stage 100 of FIG. 1 suffers from the so-called Miller effect. The Miller effect is an unwanted non-linear type of feedback affecting nearly all active discrete devices, for example junction field effect transistors (JFET), metal oxide semiconductor field effect transistors (MOSFET), bipolar transistors and so on. The Miller effect impairs performance at high frequencies and even impacts audio quality at much lower frequencies. Typically, the Miller effect occurs as the voltage varies between for example a gate terminal and a drain terminal of a JFET, as the non-linear inherent capacitance is modulated by the signal voltage. Higher voltage gains will increase this problem.

Figure 2:
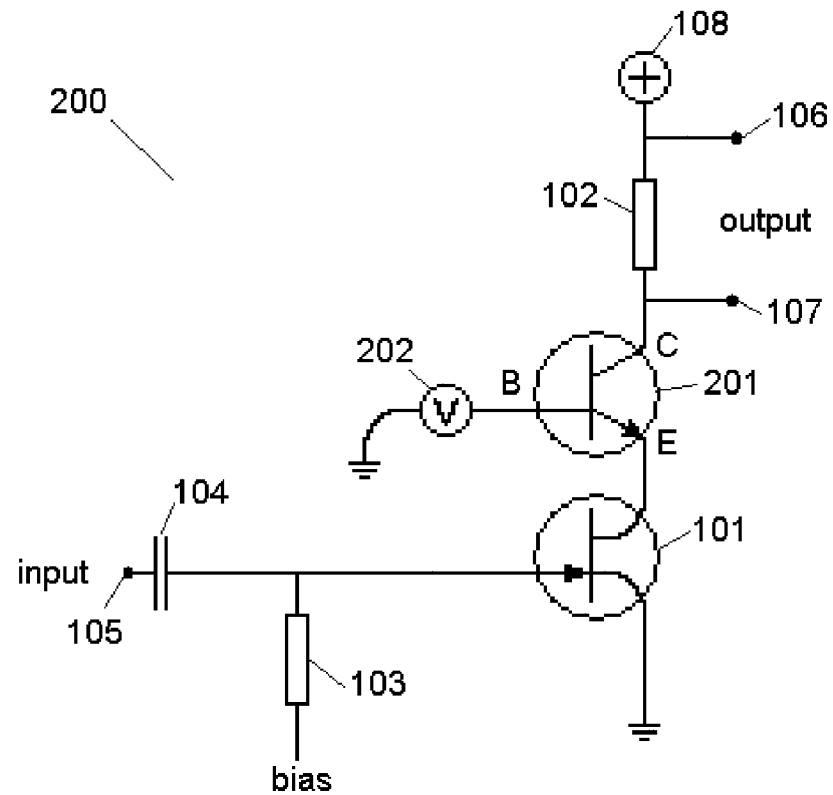
FIG. 2 shows a circuit diagram of a cascode amplifier.

To reduce the Miller effect and thus making the amplifier stage more linear, a cascode amplifier can be used. FIG. 2 shows a circuit diagram of an exemplary cascode amplifier stage 200. A bipolar transistor 201 is coupled between the drain terminal of the JFET 101 and the output resistor 102. A collector terminal C of the transistor 201 is coupled to the output resistor 102, and an emitter terminal E of the transistor 201 is coupled to the drain terminal of JFET 101. A base terminal B of the bipolar transistor 201 is connected to a constant voltage 202. In this amplifier stage 200 the bipolar transistor 201 is placed as a load of the drain terminal of the JFET 101. Because at operating frequencies, the base terminal of the bipolar transistor 201 is effectively held at the voltage 202, the voltage at the emitter E of the bipolar transistor 201 is held at nearly constant voltage during operation. In other words, the bipolar transistor 201 exhibits a low input resistance to JFET 101, making the voltage gain of the JFET 101 very small, which reduces the Miller feedback capacitance from the drain terminal to the gate terminal of the JFET 101. This loss of voltage gain is recovered by the bipolar transistor 201. Thus, the bipolar transistor 201 permits JFET 101 to operate with minimum negative feedback, improving its bandwidth. However, this will reduce the Miller effect, but will not eliminate it.

Figure 3:
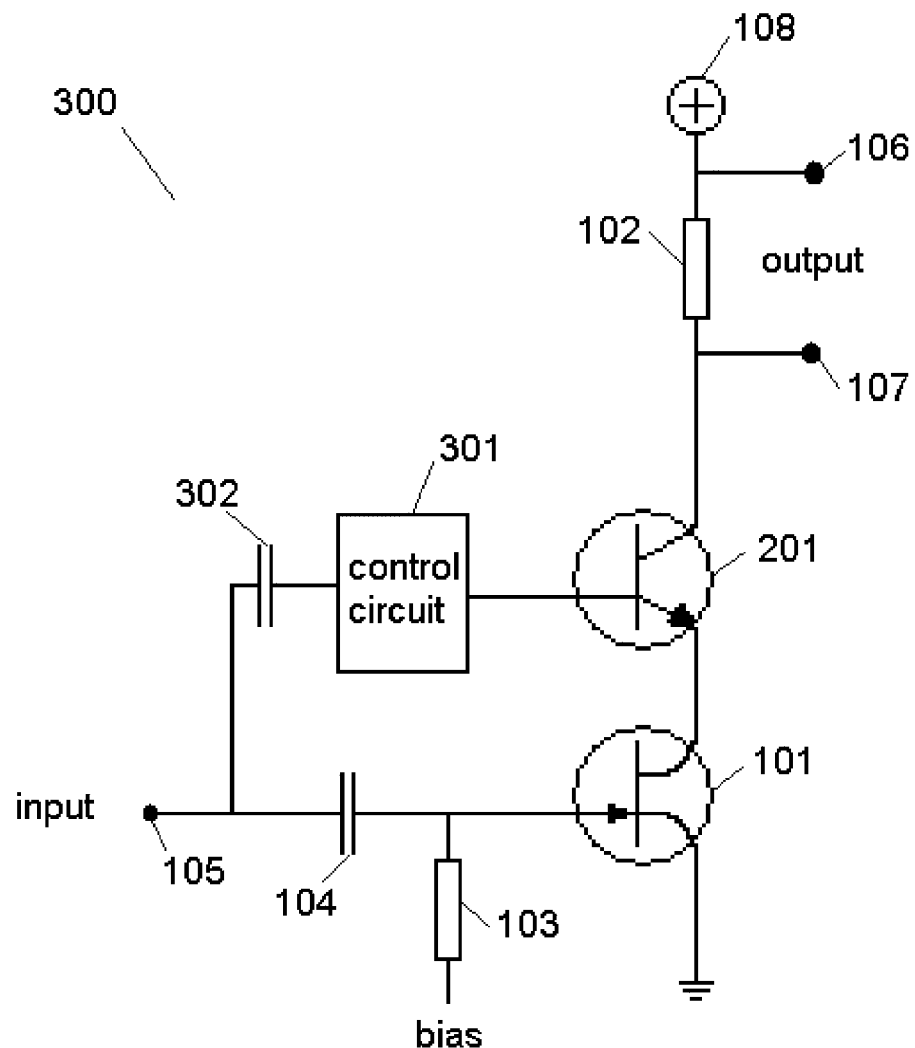
FIG. 3 shows a circuit diagram of an amplifier stage according to an embodiment of the present invention.

FIG. 3 shows an embodiment of an amplifier stage 300 according to an embodiment of the present invention. The amplifier stage 300 is based on the amplifier stage 100 shown in FIG. 1, wherein a bipolar transistor 201 is coupled between the drain terminal of the JFET 101 and the output resistor 102. As can be seen from FIG. 3, an emitter terminal of the bipolar transistor 201 is connected to a drain terminal of the JFET 101, and a collector terminal of the bipolar transistor 201 is connected to the output resistor 102. The amplifier stage 300 comprises furthermore a control circuit 301 acting as an isolating buffer connecting a base terminal of the bipolar transistor 201 via a capacitor 302 of the amplifier stage 300 with the input terminal 105 of the amplifier stage 300. The control circuit 301 forces the voltage of the drain terminal of the JFET 101 to follow the input voltage at the gate terminal of the JFET 101, and preventing at the same time any coupling from the output signal of the amplifier stage 300 at the output terminals 106, 107 to the input signal of the amplifier stage at input terminal 105. Consequently, no voltage swing will occur across the non-linear capacitance between the gate terminal and the drain terminal of the JFET 101, thus eliminating the Miller effect at the JFET 101.

As the input signal is also fed from the input terminal 105 via the capacitor 302 and the control circuit 301 to the base terminal of the bipolar transistor 201, the low Ohmic emitter of the bipolar transistor 201 will easily control the high Ohmic drain of the JFET 101. However, to avoid instead getting the Miller effect at the bipolar transistor 201, its base terminal needs to be fed through an isolating and fast buffering performed by the control circuit 301. The buffering must have good backwards isolation properties, which means that any voltage applied to the output of the control circuit 301, is not allowed to propagate to the input of the control circuit 301 regardless of the frequency. The voltage applied to the output of the control circuit 301 may be induced through the non-linear collector-base capacitance of the bipolar transistor 201.

Figure 4:
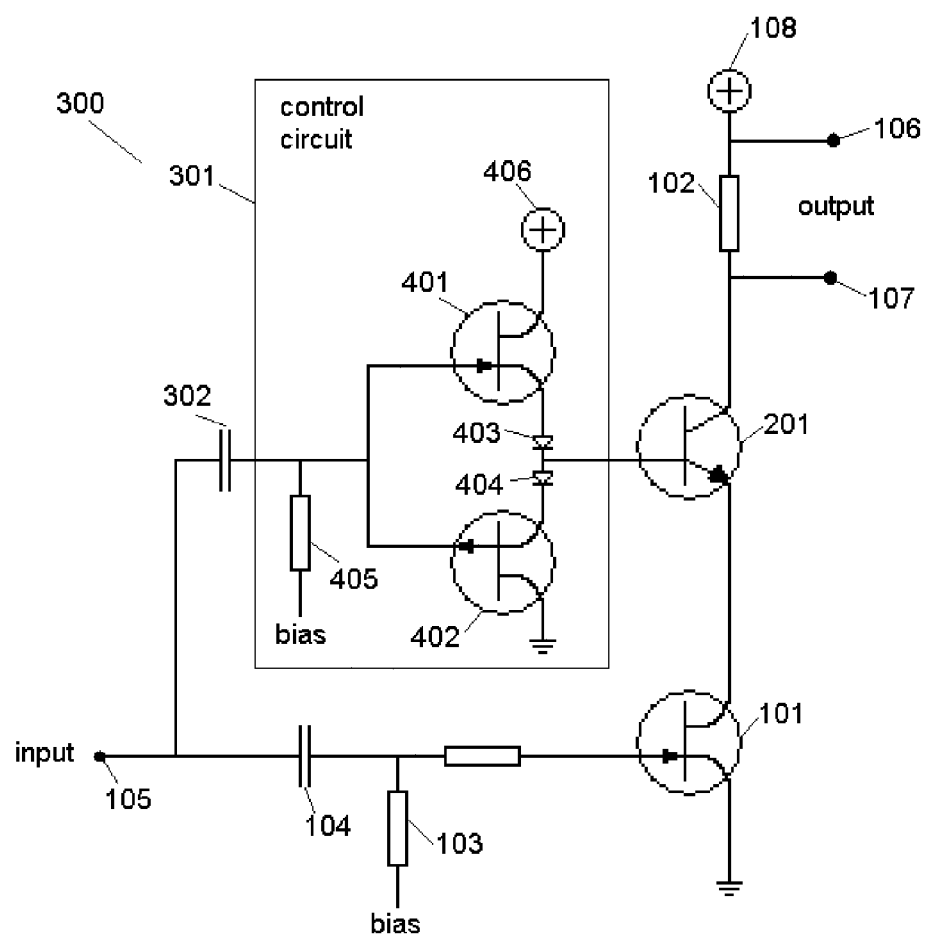
FIG. 4 shows a more detailed circuit diagram of the amplifier stage of FIG. 3.

FIG. 4 shows a more detailed circuit diagram of the amplifier stage 300 of FIG. 3. As can be seen from FIG. 4, the control circuit 301 comprises an n-channel junction field effect transistor (JFET) 401, a p-channel junction field effect transistor (JFET) 402, a first diode 403, a second diode 404 and a bias resistor 405. A drain terminal of the JFET 401 is connected to a supply voltage 406. The supply voltage 406 may be different to the supply voltage 108 depending on desired output voltages and application specific requirements. A source terminal of the JFET 401 is connected via a diode 403 to the base terminal of transistor 201. A drain terminal of the JFET 402 is connected to ground. A source terminal of the JFET 402 is connected via a second diode 404 to the base terminal of the bipolar transistor 201. Gate terminals of the JFETs 401 and 402 are commonly connected to the bias resistor 405 and via the capacitor 302 to the input terminal 105 of the amplifier stage 300. The other end of the bias resistor 405 is connected to a bias voltage. The bias voltage of bias resistor 405 may be different to the bias voltage of bias resistor 103 depending on the application requirements.

The above-described control circuit 301 realizes a complementary JFET source follower which is used as an isolating buffer. The diodes 403 and 404 provide a source biasing of the JFETs 401, 402 of the control circuit 301. Therefore, no voltage from the amplifier output signal at output terminals 106, 107 is allowed to propagate or couple to the input terminal 105 of the amplifier stage 300. Furthermore, the voltage between the gate terminal and the drain terminal of the JFET 101 is kept constant as the input voltage at the input terminal 105 varies. Consequently, the Miller effect is completely eliminated.

Figure 5:
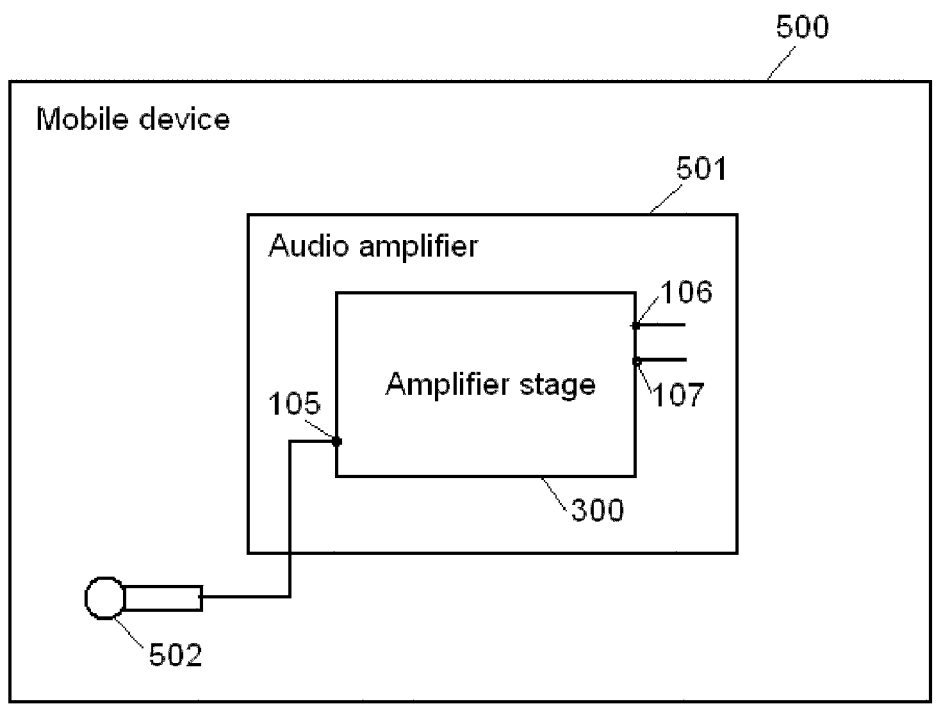
FIG. 5 shows a block diagram of a mobile device according to an embodiment of the present invention.

FIG. 5 shows a mobile device 500 comprising a microphone 502 and an audio amplifier 501. The audio amplifier 501 comprises the amplifier stage 300 for amplifying an audio signal received by the microphone 502. The microphone 502 is connected to the input terminal 105 of the amplifier stage 300 and the amplified audio signal from microphone 502 is provided at the output terminals 106, 107 of the amplifier stage 300 for further processing in the audio amplifier 501 or the mobile device 500. The mobile device 500 may be a mobile phone, a personal digital assistant, a mobile navigation system, or a mobile computer.

While exemplary embodiments have been described above, various modifications may be implemented in other embodiments. For example, the amplifier stage 300 may be used not only as an amplifier stage for amplifying an audio signal from a microphone, as depicted in FIG. 5, but may also be used as an amplifier stage for amplifying any kind of audio signal, video signal or any other kind of signals. Furthermore, although in the above-described embodiments specific types of transistors are used, the method for eliminating the Miller effect will work with any kind of discrete active devices. Additionally, any other kind of suitable control circuit can be used. For example, the control circuit may comprise a non-complementary buffer under certain circumstances, e.g. limited bandwidth or small signal amplitudes.

Finally, it is to be understood that all the embodiments described above are considered to be comprised by the present invention as it is defined by the appended claims.

What is claimed is:

1. An amplifier stage for generating an amplified output signal at an output terminal of the amplifier stage from an input signal at an input terminal of the amplifier stage, the amplifier stage comprising:

a first active device having a first terminal, a second terminal, and a control input controlling a current between the first terminal and the second terminal of the first active device, the control input of the first active device being coupled to the input terminal of the amplifier stage, a second active device having a first terminal, a second terminal, and a control input controlling a current between the first terminal and the second terminal of the second active device, the first terminal of the second active device being coupled to the second terminal of the first active device, and the second terminal of the second active device being coupled to the output terminal of the amplifier stage, and a control circuit coupled between the control input of the second active device and the input terminal of the amplifier stage, the control circuit being adapted to force a voltage at the second terminal of the first active device to follow the input voltage at the control input of the first active device, and wherein the control circuit comprises a complementary JFET source follower composed of a p-channel junction field effect transistor and an n-channel junction field effect transistor, wherein a source terminal of the p-channel transistor is coupled to the control input of the second active device, a source terminal of the n-channel transistor is coupled to the control input of the second active device, a gate terminal of the p-channel transistor is coupled to the input terminal of the amplifier stage, and a gate terminal of the n-channel transistor is coupled to the input terminal of the amplifier stage.

2. The amplifier stage according to claim 1, wherein the control circuit is further adapted to prevent any coupling from the output signal to the input signal of the amplifier stage.

3. The amplifier stage according to claim 1, further comprising a resistor coupled between the output terminal of the amplifier stage and a supply voltage.

4. The amplifier stage according to claim 1, further comprising a first capacitor coupling the input terminal of the amplifier stage to the control input of the first active device, and a second capacitor coupling the input terminal of the amplifier stage to the control input of the second active device.

5. The amplifier stage according to claim 4, further comprising a bias resistor coupled between the control input of the first active device and a bias voltage.

6. The amplifier stage according to claim 1, wherein the first active device comprises a device selected from the group comprising a transistor, a bipolar transistor, a field effect transistor, and a junction field effect transistor.

7. The amplifier stage according to claim 1, wherein the second active device comprises a device selected from the group comprising a transistor, a bipolar transistor, a field effect transistor, and a junction field effect transistor.

8. The amplifier stage according to claim 1, wherein the control circuit further comprises a first diode and a second diode, the first diode coupling the source terminal of the n-channel transistor to the control input of the second active device, and the second diode coupling the source terminal of the p-channel transistor to the control input of the second active device.

9. The amplifier stage according to claim 1, wherein the control circuit further comprises a bias resistor coupling the gate terminal of the n-channel transistor and the gate terminal of the p-channel transistor to a bias voltage.

10. A mobile device comprising a microphone and an audio amplifier coupled to the microphone, the audio amplifier comprising an amplifier stage for generating an amplified output signal at an output terminal of the amplifier stage from an input signal from the microphone at an input terminal of the amplifier stage, the amplifier stage comprising:

a first active device having a first terminal, a second terminal, and a control input controlling a current between the first terminal and the second terminal of the first active device, the control input of the first active device being coupled to the input terminal of the amplifier stage, a second active device having a first terminal, a second terminal, and a control input controlling a current between the first terminal and the second terminal of the second active device, the first terminal of the second active device being coupled to the second terminal of the first active device, and the second terminal of the second active device being coupled to the output terminal of the amplifier stage, and a control circuit coupled between the control input of the second active device and the input terminal of the amplifier stage, the control circuit being adapted to force a voltage at the second terminal of the first active device to follow the input voltage at the control input of the first active device, and wherein the control circuit comprises a complementary JFET source follower composed of a p-channel junction field effect transistor and an n-channel junction field effect transistor, wherein a source terminal of the p-channel transistor is coupled to the control input of the second active device, a source terminal of the n-channel transistor is coupled to the control input of the second active device, a gate terminal of the p-channel transistor is coupled to the input terminal of the amplifier stage, and a gate terminal of the n-channel transistor is coupled to the input terminal of the amplifier stage.

11. The mobile device according to claim 10, wherein the mobile device comprises a device selected from the group consisting of a mobile phone, a personal digital assistant, a mobile navigation system, and a mobile computer.

* * * * *